(12) United States Patent
Guthrie et al.

(10) Patent No.: US 8,494,180 B2
(45) Date of Patent: Jul. 23, 2013

(54) SYSTEMS AND METHODS TO REDUCE IDLE CHANNEL CURRENT AND NOISE FLOOR IN A PWM AMPLIFIER

(75) Inventors: Travis John Guthrie, Austin, TX (US); Daniel Chieng, Austin, TX (US)

(73) Assignee: Intersil Americas Inc., Milpitas, CA (US)

( * ) Notice: Subject to any disclaimer, the term of this patent is extended or adjusted under 35 U.S.C. 154(b) by 542 days.

(21) Appl. No.: 12/858,700

(22) Filed: Aug. 18, 2010

(65) Prior Publication Data
US 2011/0170709 A1    Jul. 14, 2011

Related U.S. Application Data

(60) Provisional application No. 61/293,586, filed on Jan. 8, 2010.

(51) Int. Cl.
*H04B 15/00* (2006.01)
(52) U.S. Cl.
USPC ................................ 381/94.2; 330/10; 700/94
(58) Field of Classification Search
USPC ............. 381/71.1–71.4, 94.1–94.5, 104–109, 381/71.11, 71.12, 111, 116–118, 120; 700/94; 330/10, 149, 250, 251; 375/238, 242
See application file for complete search history.

(56) References Cited

U.S. PATENT DOCUMENTS

| | | | |
|---|---|---|---|
| 5,649,054 A | 7/1997 | Oomen et al. | |
| 6,972,705 B1 | 12/2005 | Fei et al. | |
| 7,313,128 B2 | 12/2007 | Andersen | |
| 7,378,904 B2 | 5/2008 | Risbo | |
| 7,432,760 B2 * | 10/2008 | Masuda et al. | 330/10 |
| 7,492,217 B2 | 2/2009 | Hansen et al. | |
| 7,577,260 B1 | 8/2009 | Hooley et al. | |
| 7,797,065 B2 * | 9/2010 | Zaucha et al. | 700/94 |
| 2004/0017854 A1 * | 1/2004 | Hansen et al. | 375/243 |
| 2005/0083115 A1 * | 4/2005 | Risbo | 330/10 |
| 2006/0103458 A1 | 5/2006 | Hansen et al. | |
| 2007/0005160 A1 | 1/2007 | Zaucha et al. | |
| 2007/0139103 A1 | 6/2007 | Roeckner et al. | |
| 2009/0116654 A1 | 5/2009 | Hansen et al. | |
| 2009/0296954 A1 | 12/2009 | Hooley et al. | |
| 2011/0254625 A1 * | 10/2011 | Kohut et al. | 330/251 |

* cited by examiner

*Primary Examiner* — Lao Lun-See
(74) *Attorney, Agent, or Firm* — Vierra Magen Marcus LLP

(57) ABSTRACT

Systems and methods provided herein decrease an idle channel noise floor and reduce power during an idle channel input for low power audio devices that include a digital pulse width modulation (PWM) amplifier having a noise shaper. An audio data signal is monitored for an idle channel condition. The noise shaper performs quantization of the audio data signal and uses noise shaper filter coefficients to shape noise resulting from the quantization. Predetermined values for the noise shaper filter coefficients are used to shape the noise resulting from quantization while the idle channel condition is not being detected. The values of the noise shaper filter coefficients are reduced so that the values move toward zeros, and the reduced values of the noise shaper filter coefficients are used to attenuate noise resulting from quantization, while the idle channel condition is being detected. The noise shaper filter coefficients are returned to the predetermined values when the idle channel condition is no longer detected. Alternative embodiments are also provided.

25 Claims, 6 Drawing Sheets

SYSTEMS AND METHODS TO REDUCE IDLE CHANNEL CURRENT AND NOISE FLOOR IN A PWM AMPLIFIER

PRIORITY CLAIM

This application claims priority under 35 U.S.C. 119(e) to U.S. Provisional Patent Application No. 61/293,586, entitled SYSTEMS AND METHODS TO REDUCE IDLE CHANNEL CURRENT AND NOISE FLOOR BY RAMPING DOWN NOISE SHAPER COEFFICIENTS, filed Jan. 8, 2010 which is incorporated herein by reference.

BACKGROUND

FIG. 1 contains a block diagram illustrating the elements of an exemplary pulse width modulation (PWM) amplifier 100 that includes a PWM controller 102, an output stage 128 and an optional output filter 130. The PWM amplifier 100 is shown as being used to drive a load 132, which can be a loudspeaker. The PWM Controller 102 is typically a monolithic integrated circuit (IC) device including an input/output (I/O) interface 104, a digital signal processor (DSP) core 106 for signal processing, and a PWM engine 110.

The I/O interface 104 receives a pulse code modulated (PCM) audio signal, typically at audio sample rates such as 44.1 kHz, 48 kHz, 96 kHz, or 192 kHz. It will typically support a variety of audio input formats such as S/PDIF, I2S, or HDA. The DSP core 106 receives audio samples from the I/O interface 104, performs signal processing effects such as crossovers, tone controls, or equalizers, and transfers the resulting digital audio signal 108 to the PWM engine 110.

The digital audio signal 108 provided to the PWM engine 110 will often be referred to hereafter as the audio data signal 108, which is the data signal input to the PWM engine 110. The PWM engine 110 will perform additional signal processing and the PCM-to-PWM transformation. The PWM engine 110 includes an interpolator block 112, a PWM correction block 120, a noise shaper 122, an optional clipper 124, and a PWM modulator 126.

In the exemplary design of FIG. 1, the audio data signal 108 can be, e.g., a 24 bit 2's complement pulse code modulated (PCM) audio data signal having an audio sampling frequency of 48 kHz. Further exemplary audio sampling frequencies include 44.1 kHz, 96 kHz and 192 kHz, but other sampling frequencies are also possible.

The audio data signal 108 (e.g., having an audio sampling frequency of 48 kHz) is then interpolated by an interpolator block 112 up to a predetermined pulse width modulation (PWM) rate. For example, the interpolator block 112 can upsample the audio data signal 108 (e.g., received from the DSP core 106) from a DSP sampling rate, e.g., 48 kHz, to a PWM switching rate, e.g., 384 kHz. As shown in FIG. 1, the interpolator block 112 can include, e.g., a front end interpolator 114, a back end interpolator 116 and a gain stage 118, but is not limited thereto. The front end interpolator 114 can interpolate up the sampling frequency by up to 4× and can include, e.g., a finite impulse response (FIR) filter with a relatively sharp cutoff. The backend interpolator 116 can interpolate up the sampling frequency by up to another 4× and can include, e.g., a simple inexpensive spline interpolator with a relatively sloppy cutoff. The interpolator gain stage 118 can, e.g., be adjusted to compensate for non-unity gain in the interpolator block 112, or used to adjust the gain of the audio data signal 108.

The output of the interpolator 112 is provided to a PWM correction block 120, which is also known as a non-linear correction block. The PWM correction block 120 applies a pre-correction (also know as pre-distortion) to the digital audio signal that approximately corrects for the non-linear artifacts created by the PCM-to-PWM conversion.

The pre-corrected (also known as pre-distorted) digital audio signal output by the PWM correction block 120 is then noise-shaped by the noise shaper 122. The noise shaper 122 can use predetermined stored noise shaper filter coefficient values and a quantizer to reduce the bit resolution, e.g., to the range of about 8-14 bits. For a specific example, the noise shaper 122 can quantize each 24-bit PCM digital audio sample to a 10-bit PCM digital audio sample and use noise shaping techniques to reduce the quantization noise within the audio band of interest (the audio band of interest can also be referred to as "in-band"), typically DC to 20 kHz or 40 kHz. The noise shaper 122 can be, e.g., a seventh order noise shaper, but is not limited thereto. A seventh order noise shaper can, e.g., use twenty-one separate 14-bit noise shaper filter coefficients to shape quantization noise, where each coefficient can have a value ranging 0 to $2^{14}$ (which may or may not be signed values, depending on implementation). The noise shaper 122 effectively moves the additional quantization noise introduced by the reduction of the signal bit resolution out of the audio band of interest so that the dynamic range of the bandwidth of interest is not limited to the bit resolution of the output data.

An optional clipping block 124 is shown between the noise shaper 122 and a PWM modulator block 126. The clipping block 124 can selectively clip signals output by the noise shaper 122 based on over-current detection (e.g., as detected by an over-current detector, not shown), in order to provide amplifier and load protection.

The PWM modulator block 126 performs a PCM-to-PWM conversion on the digital audio signal (e.g., a 10 bit signal) it receives and generates PWM output signals. The PWM output signals are used to drive the output stage 128, with can include, e.g., a pair of high voltage power FETs. The output of the high voltage power FETs can be optionally filtered by a filter 130, e.g., an LC filter, to remove a switching carrier and remove out-of-band noise. The filter 130 can be part of the amplifier, or external to the amplifier. The filtered (or non-filtered) output of the FET's is then applied to the load 132. This load 132 is typically a loudspeaker that converts the filtered output of the FET's to an audible signal. In a specific embodiment, the output stage is a 3-level PWM output stage, in which case the optional filter 130 is not needed, and thus, is typically not included. The output stage 128 is typically powered by a relatively high voltage (HV+), and thus, it is often the highest power consuming stage of the amplifier 100. Different output stages and filters than shown in FIG. 1 may be used.

As mentioned above, the noise shaper 122 performs digital filtering and quantizing using predetermined values for noise shaper filter coefficients and a quantizer. Normally, the noise shaper 122 uses its quantizer to perform quantization of the audio data signal 108 (after the audio data signal 108 has already been upsampled and pre-corrected) and shapes noise resulting from quantization of the audio data signal using the predetermined noise shaper filter coefficient values (also referred to as predetermined values for noise shaper filter coefficients, or predetermined values of noise shaper filter coefficients) in order to allow for an increase in dynamic range in a specific bandwidth of interest. This moves the added quantization noise power out of the audio band of interest, and the quantization noise power (which is out-of-band noise) is dissipated in the load.

Typically the noise shaper 122 reduces the in-band quantization noise of the digital PWM amplifier system. However, when the audio data signal 108 drops below the in-band noise floor of the noise shaper 122, the noise shaper 122 is the limiting factor of the performance as opposed to the quantization noise added by the noise shaper 122. A filter (e.g., filter 130) can reduce the out-of-band noise power, but in a filterless design, most of the out-of-band noise power is dissipated directly into the load 132. The audio data signal 108 may drop below the in-band noise floor of the noise shaper, e.g., when an idle channel condition occurs.

SUMMARY

Specific embodiments of the present invention can be used to decrease an idle channel noise floor and reduce power during an idle channel input for low power audio devices that include a digital pulse width modulation (PWM) amplifier having a noise shaper. Such a noise shaper is adapted to perform quantization of an audio data signal and shape noise resulting from quantization of the audio data signal using noise shaper filter coefficients.

In accordance with an embodiment, an audio data signal is monitored for an idle channel condition. Predetermined values for the noise shaper filter coefficients are used to shape the noise resulting from quantization of the audio data signal while the idle channel condition is not being detected. While the idle channel condition is being detected, the values of the noise shaper filter coefficients are reduced so that the values move toward zeros, and the reduced values of the noise shaper filter coefficients are used to attenuate noise resulting from quantization of the audio data signal. If all the values of the noise shaper filter coefficients are reduced to zeros while the idle channel condition is being detected, the values of the noise shaper filter coefficients are maintained at zeros until the idle channel condition is no longer detected. When the idle channel condition is no longer detected, the noise shaper filter coefficients are returned to the predetermined values.

In accordance with an embodiment, the audio data signal can be monitored for the idle channel condition by comparing the audio data signal to a predetermined signal level threshold, and detecting the idle channel condition in dependence on results of the comparing. The predetermined signal level threshold can be specified in dependence on an in-band noise floor of the noise shaper corresponding to use of the noise shaper with the predetermined values for the noise shaper filter coefficients. For example, the predetermined signal level threshold can be equal to the in-band noise floor of the noise shaper. Alternatively, the predetermined signal level threshold can be equal to the in-band noise floor of the noise shaper minus a predetermined offset (e.g., about 6 dB).

In accordance with an embodiment, the values of the noise shaper filter coefficients can be reduced by periodically decrementing the values of the noise shaper filter coefficients while the idle channel condition is being detected. The values can be reduced, e.g., in a linear or non-linear manner.

In accordance with alternative embodiments of the present invention, rather than reducing the values of the noise shaper filter coefficients when an idle channel condition is being detected, the gain of a gain stage (that is downstream of the noise shaper) is reduced when the idle channel condition is being detected. More specifically, in such embodiments, a predetermined gain for the gain stage is used while the idle channel condition is not being detected. Then, while the idle channel condition is being detected, the gain for the gain stage is reduced (e.g., ramped down) so that the gain moves towards zero. Here the reduced gain attenuates noise resulting from quantization of the audio data signal by the noise shaper, while the idle channel condition is being detected. If the gain for the gain stage is reduced to zero while the idle channel condition is being detected, the gain is maintained at zero until the idle channel condition is no longer detected. When the idle channel condition is no longer detected, the gain for the gain stage is increased (e.g., ramped up) to the predetermined gain.

This summary is not intended to summarize all of the embodiments of the present invention. Further and alternative embodiments, and the features, aspects, and advantages of the embodiments of invention will become more apparent from the detailed description set forth below, the drawings and the claims.

DETAILED DESCRIPTION

Figure 1:
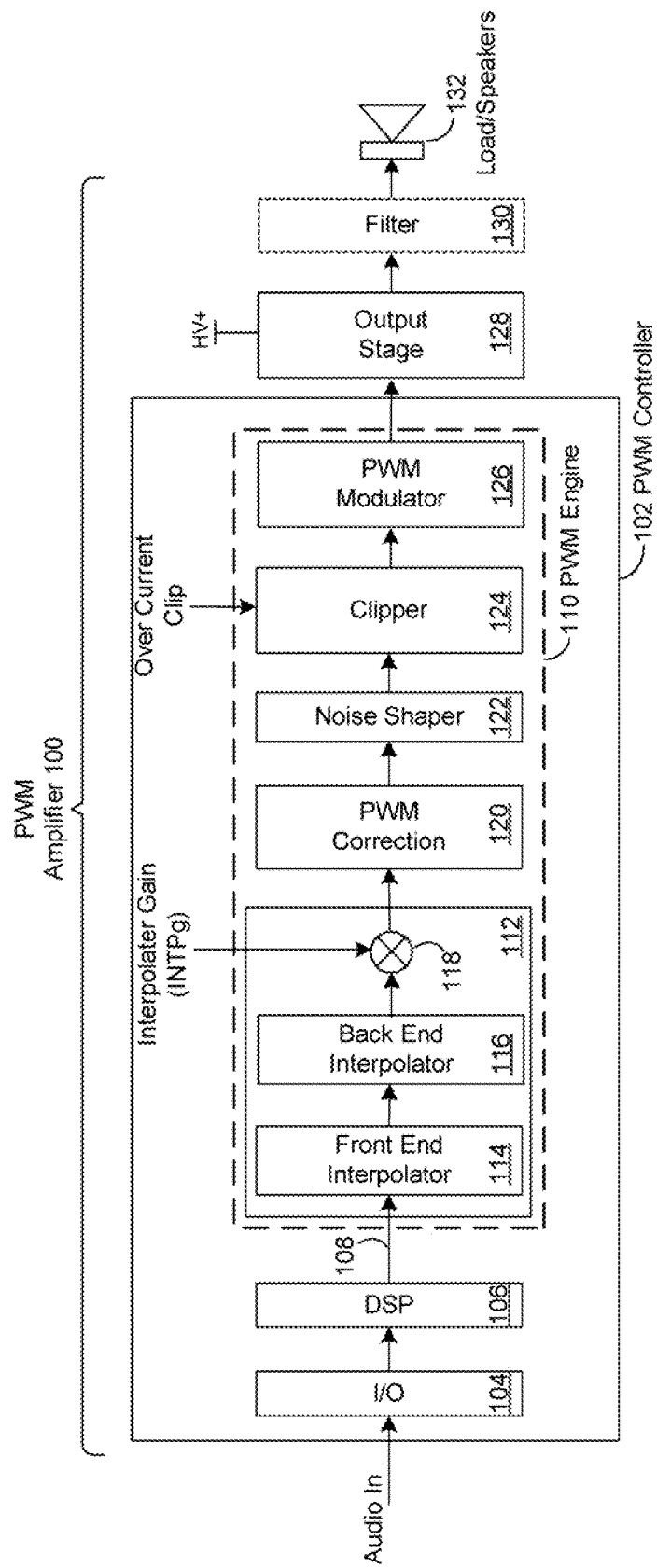
FIG. 1 is a block diagram of an exemplary pulse width modulation (PWM) amplifier.

As mentioned above, with reference to FIG. 1, the audio data signal 108 may drop below the in-band noise floor of the noise shaper 122, e.g., when an idle channel condition occurs. As also mentioned above, when the audio data signal 108 drops below the in-band noise floor of the noise shaper 122, the noise shaper 122 is the limiting factor of the performance as opposed to the quantization noise added by the noise shaper 122. Embodiments of the present invention, as will be described below, can be used to decrease an idle channel noise floor and reduce power during an idle channel input for low power consumer audio devices.

In normal operation, the out-of-band power is much lower than the audio data signal, and the audio data signal is well above the in-band noise floor. However, when the audio data signal drops below the in-band noise floor of the noise shaper 122, the noise shaper 122 is no longer improving the resulting audio output. Further, if there is no filter (e.g., no filter 130) between the output stage 128 and the load 132 driven by the output stage, excessive power is dissipated by the load due to out-of-band noise when the audio data signal drops below the in-band noise floor.

In accordance with an embodiment, by selectively reducing the values of the noise shaper filter coefficients, the in-band noise floor is lowered and the out-of-band power dissipation is reduced as well, with substantially no audio artifacts. More specifically, when the input data signal drops below a certain level, the output power dissipation becomes dominated by the wideband noise as opposed to the audio data signal. At that point, values of the noise shaper filter coefficients are ramped down to zeros, in accordance with an embodiment of the present invention. When the values of the noise shaper filter coefficients are ramped down to zeros, the noise shaper no longer functions as a noise shaper, eventually just outputting zeros. At that point, in-band noise is gone and so is the wideband noise. Consequently this causes the PWM modulator to modulate at a constant 50% duty cycle which does not have any power dissipation due to quantization noise from the noise shaper. At that point, the in-band noise floor will be dominated by other noise, e.g., noise of the power supply and clock jitter of a phase locked loop (not shown).

Figure 2:
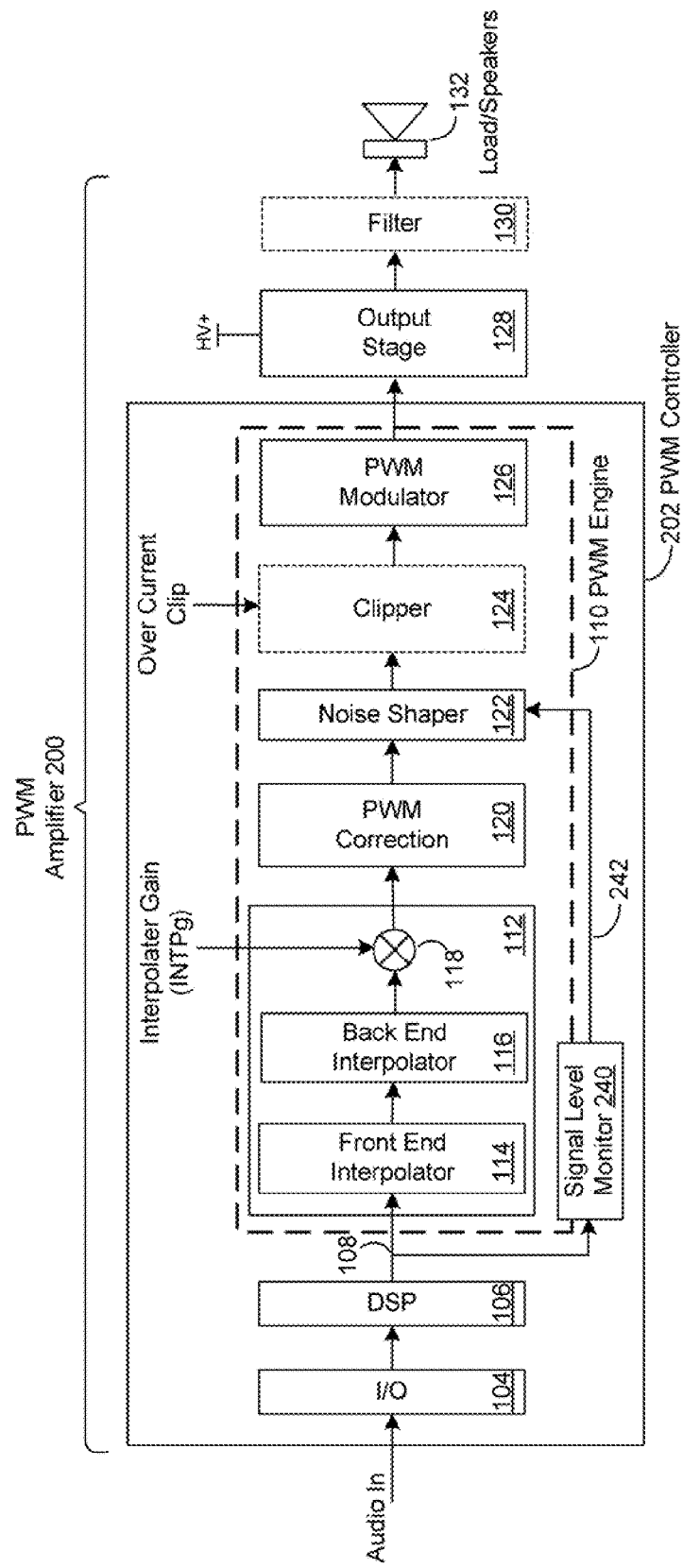
FIG. 2 is a block diagram of a PWM amplifier according to an embodiment of the present invention.

FIG. 2 illustrates a PWM amplifier 200 according to an embodiment of the present invention. In FIG. 2, components of the amplifier 200 that are the same or similar to the components of the amplifier 100 (shown in FIG. 1) are labeled the same, and are not re-explained. Referring to FIG. 2, the PWM amplifier 200 is shown as including a signal level monitor 240 that can detect an idle channel condition, e.g., when the input signal drops below a predetermined signal level threshold for at least a specified period (or for at least a first specified period within a second longer specified period). The signal level monitor 240 can be within or external the PWM engine 110, and is shown as being within the PWM controller 202. The predetermined signal level threshold used to define the idle channel condition can be, e.g., the in-band noise floor of the noise shaper corresponding to use of the noise shaper with the predetermined values for the noise shaper filter coefficients, or the in-band noise floor of the noise shaper 122 minus an offset (e.g., 6 dB), but is not limited thereto. Such an in-band noise floor can be calculated or measured, depending on implementation.

In response to detecting the idle channel condition, the signal level monitor 240 can assert an idle channel indication signal 242 that is provided to the noise shaper 122.

In response to the idle channel indication signal being asserted, the noise shaper 122 can attenuate the filter coefficients values of the noise shaper 122 by gradually ramping them down to zeros, resulting in a lower in-band noise floor and reduced out-of-band power dissipation.

The attenuating can be performed in a linear manner using simple periodic decrementing (e.g., a simply subtraction by one), or in a non-linear manner, but is not limited thereto. Thereafter, when the signal level monitor 240 detects that the audio data signal 108 rises above the predetermined signal level threshold, the signal level monitor can de-assert the idle channel indication signal 242, and the noise shaper 122 can resume its normal operation using its predetermined values for noise shaper filter coefficients.

Figure 3:
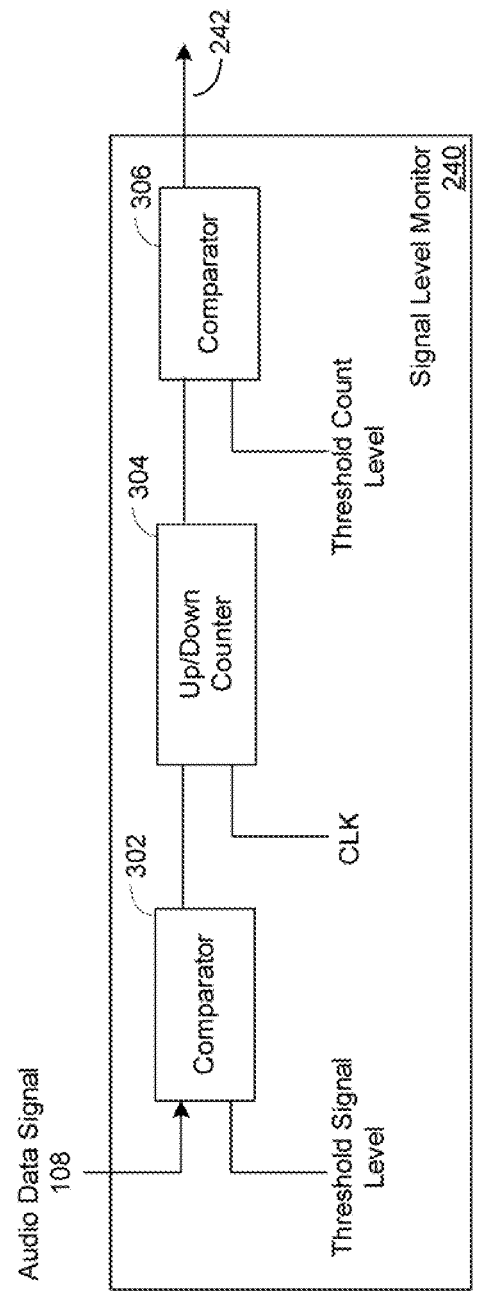
FIG. 3 is a block diagram of the signal level monitor introduced in FIG. 2, according to an embodiment of the present invention.

An exemplary implementation of the signal level monitor 240 is shown in FIG. 3. Referring to FIG. 3, the signal level monitor 240 can include a digital comparator 302, an up/down counter 304 and another digital comparator 306. The digital comparator 302 is shown as comparing the audio data signal 108 to a predetermined signal level threshold, which can be stored in a register, ROM, or the like. As mentioned above, the predetermined signal level threshold can be, e.g., the in-band noise floor of the noise shaper 122, or the in-band noise floor of the noise shaper 122 minus an offset (e.g., 6 dB), but is not limited thereto. The comparator 302 can be configured such that its output is HIGH when the audio data signal 108 is below the predetermined signal level threshold, and its output is LOW when the audio data signal 108 is above the predetermined signal level threshold. The output of the comparator 302, along with a clock signal (CLK) is provided to the up/down counter 304, which counts up when its input is HIGH and counts down when its input is LOW. The comparator 306 compares the output of the up/down counter, which is a count value, to a predetermined count value threshold, which can be stored in a register, ROM, or the like. In this implementation, when the predetermined count value threshold is exceeded, the idle channel indication signal is asserted (e.g., goes HIGH), and when the predetermined count value threshold is not exceeded, the idle channel indication signal is de-asserted (e.g., goes LOW). Other types of low pass filters, integrators and/or logic can be used to implement the signal level monitor 240, which are also within the scope of the present invention.

Figure 4:
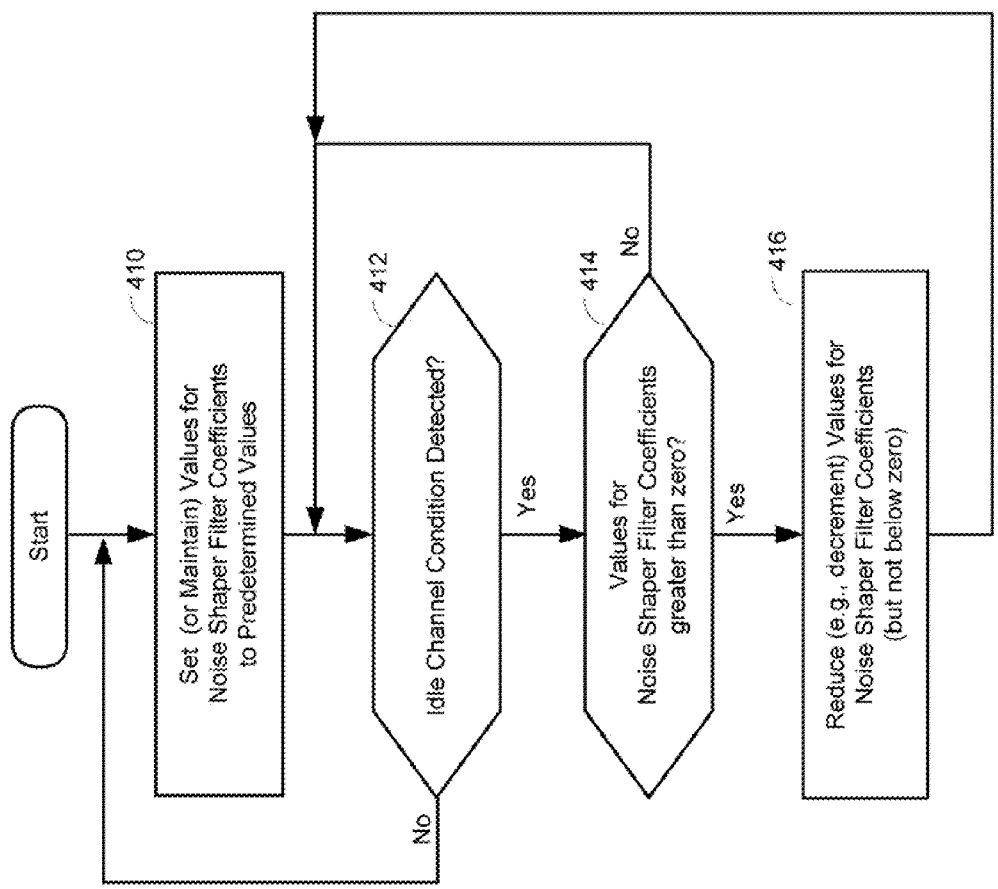
FIG. 4 is a high level flow diagram that is used to summarize methods according to embodiments of the present invention.

Methods of embodiments of the present invention will now be summarized with reference to the high level flow diagram of FIG. 4. Referring to FIG. 4, at step 410 the values for the noise shaper filter coefficients are set to predetermined values, e.g., by reading such values from registers, ROM, or the like. As mentioned above, such noise shaper filter coefficients can include a plurality (e.g., twenty-one) separate multi-bit (e.g., 14-bit) noise shaper filter coefficients, where each coefficient can have a value within a specified range (e.g., a range from 0 to $2^{14}$).

At step 412, there is a determination (e.g., by the signal level monitor 240) of whether an idle channel condition is detected. Step 412 can include, e.g., comparing the audio data signal 108 to a predetermined signal level threshold, and detecting the idle channel condition in dependence on low pass filtered results of the comparing. As mentioned above, the predetermined signal level threshold can be equal to a measured or calculated in-band noise floor of the noise shaper corresponding to use of the noise shaper with the predetermined values for the noise shaper filter coefficients, or equal to such an in-band noise floor of the noise shaper minus a specified offset, but is not limited thereto.

If there is a determination at step 412 that the idle channel condition is detected, then flow goes to step 414 where there is a determination of whether one or more of the values for the noise shaper filter coefficients is/are greater than zero(s). If the idle channel condition is detected (at step 412), and one or more of the value(s) for the noise shaper filter coefficients are determined to be greater than zero(s) (at step 414), then at step 416 the values of the noise shaper filter coefficients (which are greater than zeros) are reduced (e.g., decremented) towards zero. If the noise filter coefficients are non-signed values, then this can be performed using simple subtraction. If the noise filter coefficients are signed values, meaning that some may be negative values, then adding can be used to reduce the negative values (and more specifically, the magnitudes of the negative values) toward zeros. It is also within the scope of the present invention to reduce noise shaper filter coefficients in other manners, including, but not limited to, using division or using multiplication by a fraction. For another example, a relatively simple shift divide by the power of two can be implemented using an arithmetic shift. Because different noise filter coefficients can have different values, some coefficients may reach zero before others. In fact, some coefficient value may start at zero, in which case they are not reduced any further.

So long as the idle channel condition is detected (at step 412), and at least one of the values of the noise shaper filter coefficients is determined to be greater than zero (at step 414), then the value(s) of the noise shaper filter coefficients are again reduced toward zeros at step 416, but values should not be reduced past zero. Reducing the noise shaper filter coefficients reduces the noise-shaping affect on quantization noise. However, when there is an idle channel condition there is essentially no signal to quantize, and thus, noise shaping is not needed.

If at step 414 it is determined that all the values of the noise shaper filter coefficients have already been reduced to zeros, then they are not reduced any further and flow returns to step 412. More specifically, once the coefficients get to zeros, they are held at zeros until the idle channel condition is no longer detected. While the coefficients are equal to zeros, the noise shaper 122 outputs zeros to the PWM modulator 126, which results in a 50% duty cycle out of the PWM modulator 126, which when running in 3-level modulation results in no power output to the load, and minimal in-band noise levels.

When the idle channel condition is no longer detected at step 412, the noise shaper filter coefficients are again set to their predetermined values at step 410, so that by the time data of a non-idle channel audio data signal arrives at the noise shaper 122, the noise shaper can effectively shape the noise. The time at which the idle channel condition is no longer detected may occur after all of the noise shaper filter coefficients values have already been reduced to zeros, after only some of the noise shaper filter coefficients values have been reduced to zeros, or before any of the noise shaper filter coefficients values were completely reduced to zeros.

Figure 5:
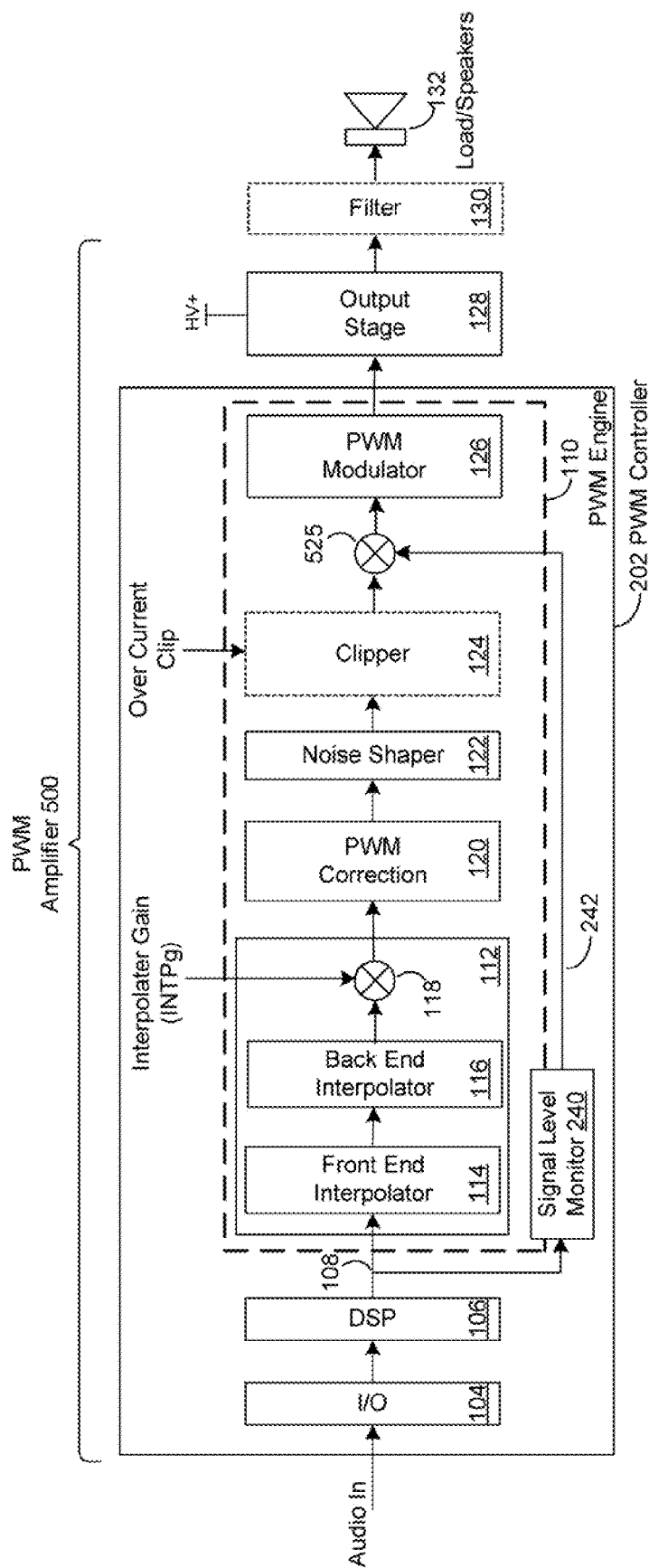
FIG. 5 is a block diagram of a PWM amplifier according to another embodiment of the present invention.
Figure 6:
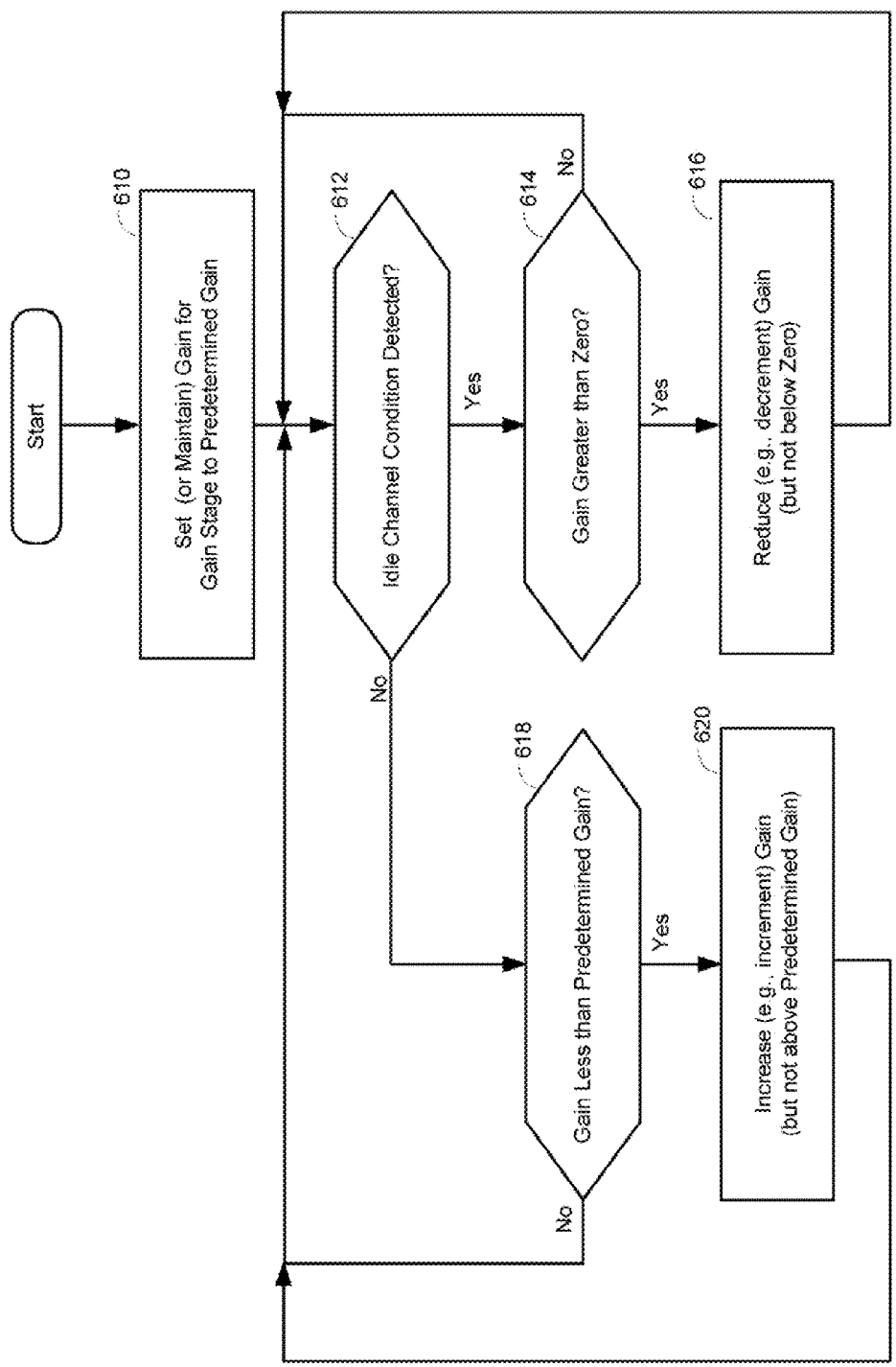
FIG. 6 is a high level flow diagram that is used to summarize methods according to other embodiments of the present invention.

In alternative embodiments, rather than ramping down the values of the noise shaper filter coefficients to zeros in response to repeatedly detecting the idle channel condition, an additional gain stage can be added downstream of the noise shaper 122, and gain of that gain stage can be ramped down from an original predetermined level towards zero in response to repeatedly detecting the idle channel condition. Then, when the idle channel condition is no longer detected, the gain of that gain stage is increased to its original predetermined level. These embodiments will also result in a lower in-band noise floor and reduced out-of band power dissipation. The gain can be increased to its original level by immediately returning the gain to its original predetermined value, or alternatively the gain can be ramped up to its original predetermined level. An example of this is shown in FIG. 5, which shows a gain stage 525 added between the noise shaper 122 and the PWM modulator 126 of a PWM amplifier 500. While shown as being added after the optional clipper 124, the gain stage 525 can alternatively be added prior to the clipper 124. In this embodiment, the gain of the gain stage 525 can be reduced in a linear (or non-linear) manner when the signal level monitor 240 asserts the idle channel indication signal 242. When the idle channel indication signal 242 is no longer asserted, the gain of the gain stage 525 can be increased immediately, or ramped up in a linear (or non-linear) manner to its original level. In an embodiment, when the idle channel condition is no longer being detected, the gain of the gain stage 525 is gradually increased (e.g., ramped up) to is predetermined gain, as opposed to being immediately returned to its predetermined gain. The high level flow diagram of FIG. 6, which includes steps 610, 612, 614, 616, 618 and 620, is used to summarize some methods of the present invention which rely on adjusting gain of a gain stage to lower in-band noise floor and reduced out-of band power. For the embodiments where the gain stage is immediately increased to its original predetermined value, when the idle channel condition is no longer detected, step 620 can instead be "Set Gain to Predetermined Gain".

Adjustment of a gain stage (e.g., gain stage 525) in dependence on whether there is an idle channel condition (as described with reference to FIGS. 5 and 6) can similarly be performed in an analog amplifier system, which is within the scope of an embodiment of the present invention.

Embodiments of the present invention described above can be used to improve amplifier performance during low input signal levels by reducing the output noise levels, and resulting power dissipation, and doing it in a graceful manner without audible artifacts.

In alternative embodiments, rather than reducing values of the noise shaper filter coefficients, or reducing the gain of a gain stage, the output stage 128 can be immediately muted or shut off completely when an idle channel condition is detected. However, the muting or shutting off options would likely result in audible audio artifacts in the output.

Embodiments of the present invention described above can be especially beneficial when used with low power consumer electronics devices. For example, conventionally when such a device is powered up, but the audio is muted, a significant amount of power is dissipated into the load, even though there is no signal. However, if such a device implemented an embodiment of the present invention, power consumption would be reduced thereby allowing for longer battery life of the resulting product (especially since power is being reduced on the supply with the highest system voltage which typically makes it the largest portion of the total power dissipation).

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art.

Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A method for use with a digital pulse width modulation (PWM) amplifier that includes a noise shaper adapted to perform quantization of an audio data signal and shape noise resulting from quantization of the audio data signal using noise shaper filter coefficients, the method comprising:
    monitoring an audio data signal for an idle channel condition;
    using predetermined values for the noise shaper filter coefficients to shape the noise resulting from quantization of the audio data signal while the idle channel condition is not being detected;
    reducing the values of the noise shaper filter coefficients so that the values move toward zeros, and using the reduced values of the noise shaper filter coefficients to attenuate noise resulting from quantization of the audio data signal, while the idle channel condition is being detected;
    if all the values of the noise shaper filter coefficients are reduced to zeros while the idle channel condition is being detected, maintaining the values of the noise shaper filter coefficients at zeros until the idle channel condition is no longer detected; and
    returning the noise shaper filter coefficients to the predetermined values when the idle channel condition is no longer detected.

2. The method of claim 1, wherein the step of monitoring the audio data signal for the idle channel condition includes comparing the audio data signal to a predetermined signal level threshold, and detecting the idle channel condition in dependence on results of the comparing.

3. The method of claim 2, wherein the predetermined signal level threshold is specified in dependence on an in-band noise floor of the noise shaper corresponding to use of the noise shaper with the predetermined values for the noise shaper filter coefficients.

4. The method of claim 3, wherein the predetermined signal level threshold is equal to the in-band noise floor of the noise shaper.

5. The method of claim 3, wherein the predetermined signal level threshold is equal to the in-band noise floor of the noise shaper minus a predetermined offset.

6. The method of claim 1, wherein the step of monitoring the audio data signal for the idle channel condition occurs upstream of the noise shaper, prior to the audio data signal being upsampled and pre-corrected for non-linear artifacts created by a downstream PCM-to-PWM conversion.

7. The method of claim 1, wherein the step of reducing the values of the noise shaper filter coefficients comprises periodically decrementing the values of the noise shaper filter coefficients while the idle channel condition is being detected so that the values move toward zeros.

8. A digital pulse width modulation (PWM) amplifier, comprising:
a signal level monitor configured to monitor an audio data signal for an idle channel condition;
a noise shaper adapted to perform quantization of the audio data signal and shape noise resulting from quantization of the audio data signal using noise shaper filter coefficients;
wherein while the idle channel condition is not being detected by the signal level monitor, the noise shaper uses predetermined values for the noise shaper filter coefficients to shape the noise resulting from quantization of the audio data signal;
wherein while the idle channel condition is being detected by the signal level monitor, the noise shaper reduces the values of the noise shaper filter coefficients so that the values move toward zeros, to thereby attenuate noise resulting from quantization of the audio data signal; and
wherein if the noise shaper reduces all the values of the noise shaper filter coefficients to zeros while the idle channel condition is being detected by the signal level monitor, the noise shaper maintains the values of the noise shaper filter coefficients at zeros until the idle channel condition is no longer detected; and
wherein the noise shaper returns the noise shaper filter coefficients to the predetermined values when the idle channel condition is no longer detected by the signal level monitor.

9. The PWM amplifier of claim 8, wherein the signal level monitor includes:
a comparator configured to compare the audio data signal to a predetermined signal level threshold; and
wherein the signal level monitor monitors for the idle channel condition in dependence on an output of the comparator.

10. The PWM amplifier of claim 9, wherein the predetermined signal level threshold is specified in dependence on an in-band noise floor of the noise shaper corresponding to use of the noise shaper with the predetermined values for the noise shaper filter coefficients.

11. The PWM amplifier of claim 10, wherein the predetermined signal level threshold is equal to the in-band noise floor of the noise shaper, or equal to the in-band noise floor of the noise shaper minus a specified offset.

12. The PWM amplifier of claim 8, wherein the noise shaper performs quantization of the audio data signal and shapes noise resulting from quantization of the audio data signal downstream from where the signal level monitor monitors the audio data signal for the idle channel condition, and after the audio data signal has been upsampled and pre-corrected for non-linear artifacts created by a downstream PCM-to-PWM conversion.

13. The PWM amplifier of claim 8, wherein while the idle channel condition is being detected by the signal level monitor, the noise shaper reduces the values of the noise shaper filter coefficients by periodically decrementing the values of the noise shaper filter coefficients.

14. The PWM amplifier of claim 8, further comprising:
a digital signal processor (DSP) core configured to process a received PCM audio signal;
an interpolator configured to upsample an output of the DSP core from a DSP sampling rate to a PWM switching rate;
a PWM correction block configured to receive an output of the interpolator;
a PWM modulator configured to receive an output of the noise shaper, which may or may not have been clipped, and to perform a PCM-to-PWM conversion to thereby generate a PWM signal; and
wherein the PWM correction block is configured to perform correction for non-linear artifacts created by the PCM-to-PWM conversion; and
wherein an output of the PWM correction block is the audio data signal provided to the noise shaper.

15. The PWM amplifier of claim 14, further comprising:
a clipper configured to selectively clip an output of the noise shaper before the output of the noise shaper is provided to the PWM modulator.

16. The PWM amplifier of claim 14, further comprising:
an output stage configured to be driven in dependence on the PWM signal.

17. A method for use with a digital pulse width modulation (PWM) amplifier that includes a noise shaper adapted to perform quantization of an audio data signal and shape noise resulting from quantization of the audio data signal using noise shaper filter coefficients, the method comprising:
monitoring an audio data signal for an idle channel condition upstream of the noise shaper;
using a predetermined gain for a gain stage that is downstream of the noise shaper, while the idle channel condition is not being detected;
reducing the gain for the gain stage so that the gain moves towards zero, and using the reduced gain to attenuate noise resulting from quantization of the audio data signal by the noise shaper, while the idle channel condition is being detected;
if the gain for the gain stage is reduced to zero while the idle channel condition is being detected, maintaining the gain at zero until the idle channel condition is no longer detected; and
increasing the gain for the gain stage to the predetermined gain when the idle channel condition is no longer detected.

18. The method of claim 17, wherein the step of monitoring the audio data signal for the idle channel condition includes comparing the audio data signal to a predetermined signal level threshold, and detecting the idle channel condition in dependence on results of the comparing.

19. The PWM amplifier of claim 17, wherein the step of increasing the gain to the predetermined gain, when the idle channel condition is no longer detected, comprises one of the following:
periodically incrementing the gain until the gain equals the predetermined gain; and setting the gain to the predetermined gain.

20. A digital pulse width modulation (PWM) amplifier, comprising:
a signal level monitor configured to monitor an audio data signal for an idle channel condition;

a noise shaper adapted to perform quantization of the audio data signal and shape noise resulting from quantization of the audio data signal using noise shaper filter coefficients; and a gain stage downstream of the noise shaper;

wherein while the idle channel condition is not being detected by the signal level monitor, a predetermined gain is used for the gain stage;

wherein while the idle channel condition is being detected by the signal level monitor, the gain for the gain stage is reduced so that the gain moves towards zero, to thereby attenuate noise resulting from quantization of the audio data signal; and wherein if the gain of the gain stage is reduced to zero while the idle channel condition is being detected by the signal level monitor, the gain for the gain stage is maintained at zero until the idle channel condition is no longer detected; and wherein the gain for the gain stage is increased to the predetermined gain when the idle channel condition is no longer detected by the signal level monitor.

21. The PWM amplifier of claim 20, wherein the signal level monitor includes:

a comparator configured to compare the audio data signal to a predetermined signal level threshold; and wherein the signal level monitor monitors for the idle channel condition in dependence on an output of the comparator.

22. The PWM amplifier of claim 20, wherein:

while the idle channel condition is being detected by the signal level monitor, the gain for the gain stage is reduced by periodically decrementing the gain; and when the idle channel condition is no longer detected by the signal level monitor, the gain for the gain stage is increased by periodically incrementing the gain.

23. The PWM amplifier of claim 20, wherein:

when the idle channel condition is no longer detected by the signal level monitor, the gain for the gain stage is increased by setting the gain to the predetermined gain.

24. The PWM amplifier of claim 20, wherein the noise shaper performs quantization of the audio data signal and shapes noise resulting from quantization of the audio data signal downstream from where the signal level monitor monitors the audio data signal for the idle channel condition, and after the audio data signal has been upsampled and pre-corrected for non-linear artifacts created by a downstream PCM-to-PWM conversion.

25. The PWM amplifier of claim 20, further comprising:

a digital signal processor (DSP) core configured to process a received PCM audio signal;

an interpolator configured to upsample an output of the DSP core from a DSP sampling rate to a PWM switching rate;

a PWM correction block configured to receive an output of the interpolator;

a PWM modulator configured to receive an output of the gain stage downstream of the noise shaper, which may or may not have been clipped, and to perform a PCM-to-PWM conversion to thereby generate a PWM signal; and wherein the PWM correction block is configured to perform correction for non-linear artifacts created by the PCM-to-PWM conversion; and wherein an output of the PWM correction block is the audio data signal provided to the noise shaper.

* * * * *